United States Patent
Lu et al.

(10) Patent No.: US 7,283,075 B2
(45) Date of Patent: Oct. 16, 2007

(54) DELTA-SIGMA MODULATOR WITH SELECTABLE NOISE TRANSFER FUNCTION

(75) Inventors: Albert K. Lu, Austin, TX (US); Yan Zhou, Austin, TX (US); Xun Yang, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 14 days.

(21) Appl. No.: 10/917,261

(22) Filed: Aug. 12, 2004

(65) Prior Publication Data

US 2006/0038709 A1 Feb. 23, 2006

(51) Int. Cl.
    *H03M 3/00* (2006.01)
(52) U.S. Cl. ..................................... 341/143
(58) Field of Classification Search ................ 341/143; 379/1.03, 1.04
    See application file for complete search history.

(56) References Cited

U.S. PATENT DOCUMENTS

| | | | |
|---|---|---|---|
| 6,489,907 B2* | 12/2002 | Cusinato et al. ............ 341/143 |
| 6,677,876 B1* | 1/2004 | Hoggarth et al. ........... 341/143 |
| 6,894,632 B1* | 5/2005 | Robinson .................... 341/143 |
| 7,006,445 B1* | 2/2006 | Cole et al. ................... 370/247 |
| 2003/0067404 A1* | 4/2003 | Ruha et al. .................. 341/143 |
| 2004/0174285 A1* | 9/2004 | Radja et al. ................ 341/143 |
| 2005/0119025 A1* | 6/2005 | Mohindra et al. ....... 455/552.1 |

OTHER PUBLICATIONS

Shoaei, O. et al., Design and implementation of a tunable 40 MHz-70 MHz Gm-C bandpass ΔΣ modulator, IEEE Transactions on Circuits and Systems II: Analog and Digital Signal Processing, Jul. 1997 vol. 44 , Issue: 7, pp. 521-530, INSPEC Accession No. 5642230.*

Shengping, Y., A tunable bandpass sigma-delta A/D conversion for mobile communication receiver, 1994 IEEE 44th Vehicular Technology Conference, Jun. 8-10, 1994 pp. 1346-1350 vol. 2, Stockholm INSPEC Accession No. 4858672; Posted online: Jun. 08, 2002.*

* cited by examiner

*Primary Examiner*—Howard L. Williams
(74) *Attorney, Agent, or Firm*—Davis & Associates; William D. Davis

(57) ABSTRACT

Delta-sigma modulators with a selectable noise transfer function are described. In various embodiments, the noise transfer function is varied in accordance with a bandwidth, a communication protocol, or an oversampling ratio of a selected communication channel.

16 Claims, 14 Drawing Sheets

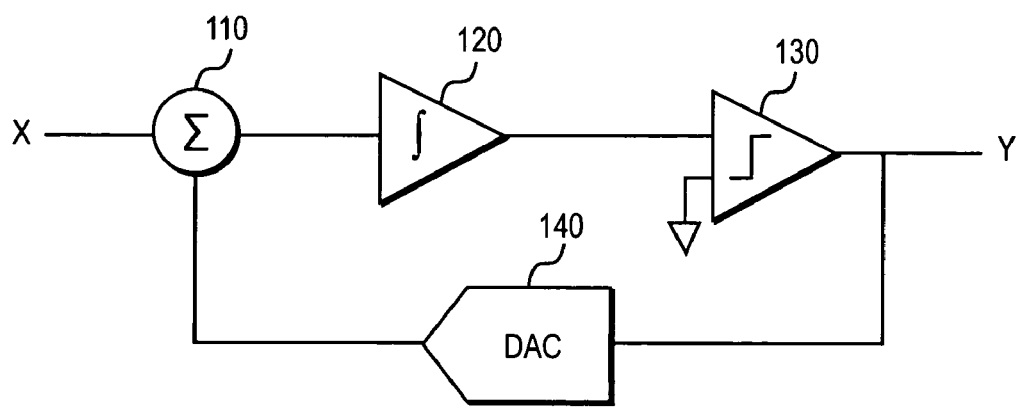
FIG. 1
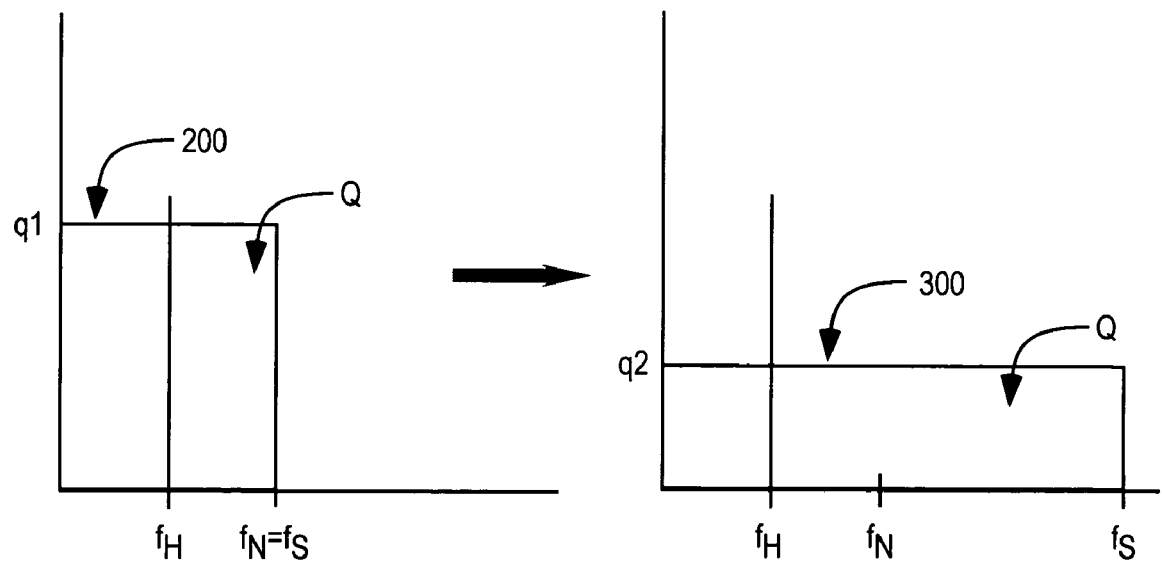
FIG. 2
FIG. 3

DELTA-SIGMA MODULATOR WITH SELECTABLE NOISE TRANSFER FUNCTION

FIELD OF THE INVENTION

This invention relates to the fields of electronics and telecommunications. In particular, this invention is drawn to quantization noise shaping.

BACKGROUND OF THE INVENTION

Numerous communication protocol standards have developed to enable using the pre-existing plain old telephone system (POTS) infrastructure for carrying digital data. Although the public switched telephone network (PSTN) is digital in nature, the connection between subscribers and the central office that serves as an entry point to the PSTN is analog. As a result, modems are used for bi-directional communication of digital data on the analog channel between the subscriber and the central office. Modems convert the communicated information between the digital and analog domains in accordance with the particular communication protocol.

Some communication protocols are designed to rely on the voiceband region of the analog channel to convey information. The data transmission rate of such voiceband modems, however, is constrained by the relatively narrow bandwidth (i.e., less than 4 kHz) of the voiceband region.

Digital subscriber lines (xDSL) services provide significantly higher data transmission rates by utilizing communication bandwidth beyond the voiceband. Frequently, xDSL services may simultaneously co-exist with voiceband communications on the same subscriber line that connects the subscriber to the central office.

Modems or other devices designed for communicating digital data on the analog channel utilize an analog front end for transmitting as well as receiving information from the subscriber line. The analog front end conditions signals communicated to or from the subscriber line before providing the conditioned signal to the subscriber line for transmission or to a digital signal processor for interpretation.

Typically, circuitry incorporated into an xDSL modem is specifically tailored to a single xDSL protocol. A modem supporting Asymmetric Digital Subscriber Line (ADSL) for example, would not be compatible with a modem supporting an Integrated Digital Services Network (ISDN) protocol or a High bit rate Digital Subscriber Line (HDSL) protocol.

Support for different protocols can be accomplished by providing distinct modems, each of which supports a single xDSL protocol. Even if the service provider were capable of providing a different xDSL service on the same physical line, a different modem would be required to support the service. The provider must thus maintain an inventory of modems to support varying xDSL standards even though the xDSL protocol is largely determined at the time of installation and is somewhat constrained by the distance of the subscriber from the xDSL provider.

SUMMARY OF THE INVENTION

A delta-sigma modulator having a variable noise transfer function is described. The modulator may be coupled to a communication medium carrying a selected channel. In various embodiments, the noise transfer function may be varied in accordance with at least one of the bandwidth, oversampling ratio, or communication protocol associated with the selected channel.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 1 illustrates a delta-sigma modulated analog-to-digital converter (ADC).

FIG. 2 illustrates noise within a first range of frequencies.

FIG. 3 illustrates noise shaping through oversampling to shift noise out of the first range of frequencies.

DETAILED DESCRIPTION

Figure 4:
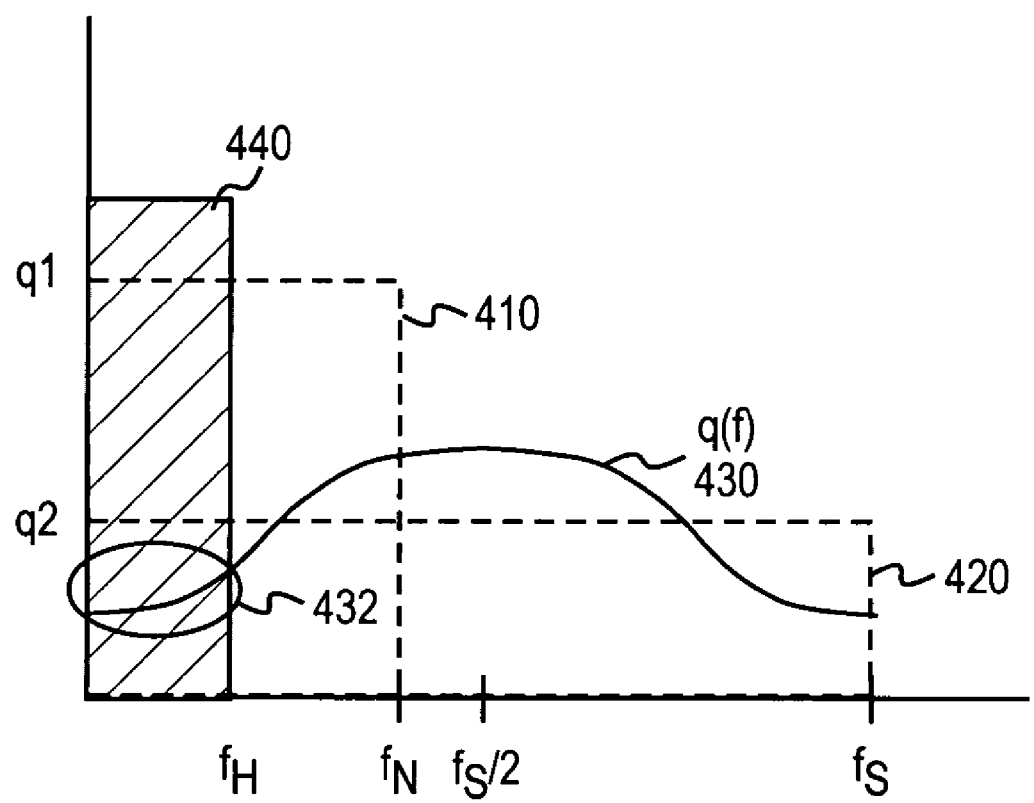
FIG. 4 illustrates noise shaping with oversampling and delta-sigma modulation.

In order to accurately sense or reproduce a time-varying signal, the signal must be sampled at no less than the Nyquist frequency. Sampling at higher rates may be necessary to achieve other signal processing goals. The higher sampling frequencies require components with greater bandwidths. Greater bandwidths tend to drive up the cost and power consumption of the components.

A delta-sigma modulated analog-to-digital converter (ADC), for example, uses a coarse quantizer within a feedback loop to suppress quantization noise within a frequency band of interest. Oversampling spreads the quantization error over a wider range of frequencies to reduce the in-band quantization noise. The oversampling ratio is measured with respect to the Nyquist frequency. For a channel having a bandwidth of approximately of 1.1 MHz (i.e., $f_H$), the Nyquist frequency is 2.2 MHz (i.e., $f_N=2f_H$). Oversampling requires sampling at some multiple m of the Nyquist frequency (i.e., in this case $f_s=2mf_h$).

FIG. 1 illustrates one embodiment of a first order 1 bit delta-sigma modulated ADC 100. Summer 110 combines an analog input signal X with the output Y of digital-to-analog converter 140 to produce a result (i.e., an error signal) corresponding to the difference between X and Y. This result is integrated by analog integrator 120. Comparator 130 (a one bit ADC) quantizes the result into a single bit, Y. Digital-to-analog converter (DAC) 140 converts this one bit value to an analog value that is combined with the analog input signal as already described.

FIG. 1 illustrates an analog-to-digital converter 100 (X: analog, Y: digital) having a DAC 140 in the feedback loop. The principles described below may be applied to a digital-to-analog converter (X: digital, Y: analog). The term "delta-sigma modulator" will be used to generically refer to both types of conversion systems unless specifically noted otherwise or the context dictates otherwise. The term "delta-sigma modulator" may be used interchangeably with "delta-sigma modulated converter". The term "processing" may be used to refer to either the ADC signal sampling and conversion operation or the DAC signal reconstruction operation.

Referring to FIG. 2, frequency $f_H$ represents the upper bound of the frequency range of interest. To ensure proper reproduction, DAC 140 must have a sample rate ($f_s$) at least as fast as the Nyquist rate $f_N$ which is twice the bandwidth of the frequency range of interest. (ADC 130 must similarly operate at $f_N$ or higher). For baseband applications, $f_N$ is typically twice the highest frequency $f_H$ of the frequency range of interest. At rates greater than twice the bandwidth of the frequency range of interest, the incoming signal is being oversampled. The amount of oversampling may be quantified using an oversampling ratio defined as $$\frac{f_S}{2BW}.$$

Without oversampling, the quantization noise 200 has a quantization noise density of q1 within the band of interest bound by $f_H$ when the modulator is operating at the Nyquist frequency such that the sampling rate is the same as the Nyquist rate ($f_s=f_N=f_H$). The total quantization noise $Q=q1 \cdot f_N$. In the absence of any other noise shaping, oversampling spreads the quantization noise evenly over the range bound by the sampling frequency. This example assumes random quantization noise.

Oversampling spreads the same quantization noise across a wider frequency band thus resulting in lower quantization noise within the band of interest. Selecting a sampling frequency greater than the Nyquist frequency spreads the same noise Q over a wider range of frequencies bound by the sampling frequency. Referring to FIG. 3, the total quantization noise Q is presumed to be evenly spread across the range having an upper bound defined by the sampling frequency $f_s$. The quantization noise 300 has a quantization noise density of q2 within the band of interest bound by $f_H$ and $Q=q2 \cdot f_S$.

Comparing FIGS. 2-3, the total quantization noise, Q, is the same. If $f_s>f_N$ (as indicated by FIG. 3), then q1>q2. Through the introduction of oversampling, the quantization noise is spread out over a greater range to reduce the in-band quantization noise. Thus quantization noise can be shaped out of the band of interest bound by $f_H$ by spreading it across a wider band having an upper bound defined by the sampling frequency, $f_S$.

Although FIG. 3 illustrates spreading the quantization noise evenly across the spectral range bound by the sampling frequency ($f_s$), delta-sigma modulators can achieve a non-linear, non-monotonic distribution of the noise Q. Delta-sigma modulator architectures can be classified based on order, number of bits, feedback loop (single loop or cascaded). The noise shifting properties may be described by a noise transfer function (NTF). The signal transfer function (STF) characterizes the distortion of the original signal due to the converter.

FIG. 4 illustrates one embodiment of a re-distribution of quantization noise through the use of a non-linear noise transfer function and oversampling (i.e., $f_s>f_N$). Oversampling alone would spread the nominal quantization noise 410 having amplitude q1 across a wider frequency range resulting in a uniform quantization noise 420 of amplitude q2, where q2<q1. The total quantization noise as a result of oversampling alone, however is the same such that $q1 \cdot f_N=q2 \cdot f_s$.

The non-linear noise transfer function of delta-sigma modulation permits further shaping. In particular, quantization noise may be shifted out of the channel 440 of interest. In the illustrated embodiment, the area under the curve q($f$) 430 is the same as that of regions 410 and 420.

The benefit of oversampling combined with delta-sigma modulation can be seen by comparing the amplitude of quantization noise within the band of interest. Within the region 432, q($f$)<q2<q1 such that the quantization noise is significantly reduced within the band or channel 440 of interest due to the noise shaping provided by delta-sigma modulation.

One application for the delta-sigma modulator is in an analog front end of an xDSL modem. xDSL variants may utilize different frequency bands. The NTF appropriate for a first band of interest associated with a first xDSL variant may not be particularly optimal for a second band of interest associated with a second xDSL variant if there are significant differences between the first and second bands of interest. Accordingly, the delta-sigma modulator may be provided with a specific noise transfer function appropriate for each xDSL communication protocol. Communication protocols frequently may be distinguished by channel bandwidth or the specific frequency range associated with a channel. The band of interest is thus typically different for distinct broadband communication protocols.

Figure 5:
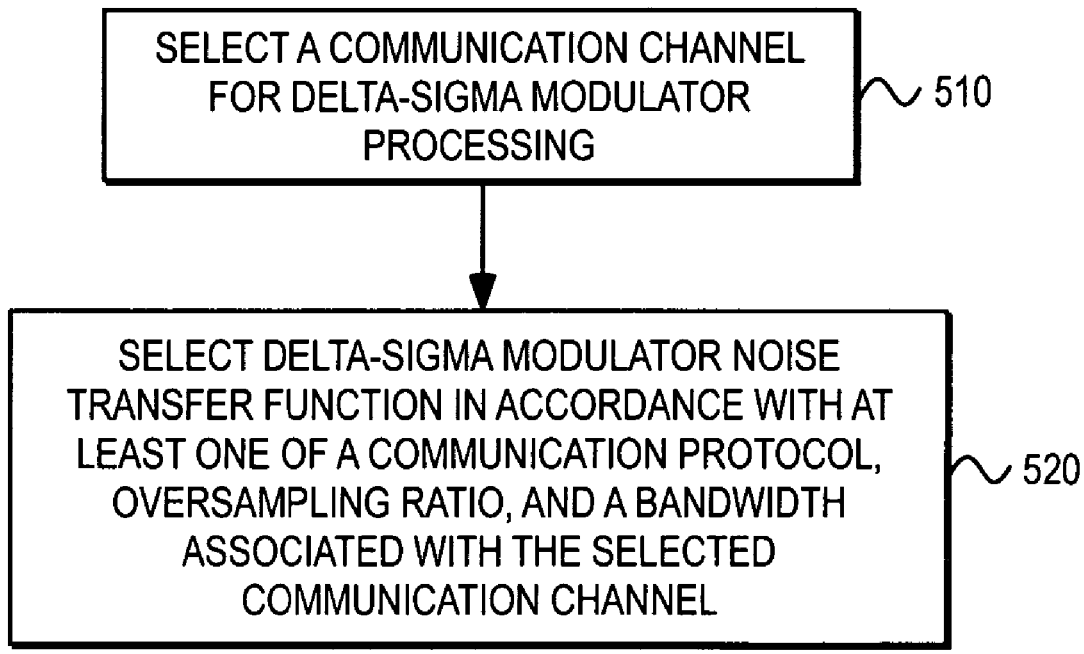
FIG. 5 illustrates a method of varying a delta-sigma modulator noise transfer function in accordance with a communication protocol.

FIG. 5 illustrates one embodiment of a method of varying a delta-sigma modulator noise transfer function to accommodate different communication protocols, oversampling ratios, or bandwidths of a selected communication channel. A communication channel is selected in step 510. In step 520, the noise transfer function of a delta-sigma modulator communicatively coupled to the communication channel is selected to vary noise shaping within the channel in accordance with at least one of the communication protocol, oversampling ratio, or bandwidth associated with the communication channel. Thus, for example, a first noise transfer function (NTF1) would be used if the selected protocol is ADSL and a distinct second noise transfer function (NTF2) would be used if the selected protocol is ADSL2+ 30 .

Shaping noise outside of one channel may be problematic if the noise is shaped into a spectral region utilized by another channel. xDSL communications, for example, frequently share the same subscriber line as voiceband communications. A description of a typical network environment for multiple channel subscriber line communications including xDSL and voiceband communications is described with respect to FIG. 6.

Figure 6:
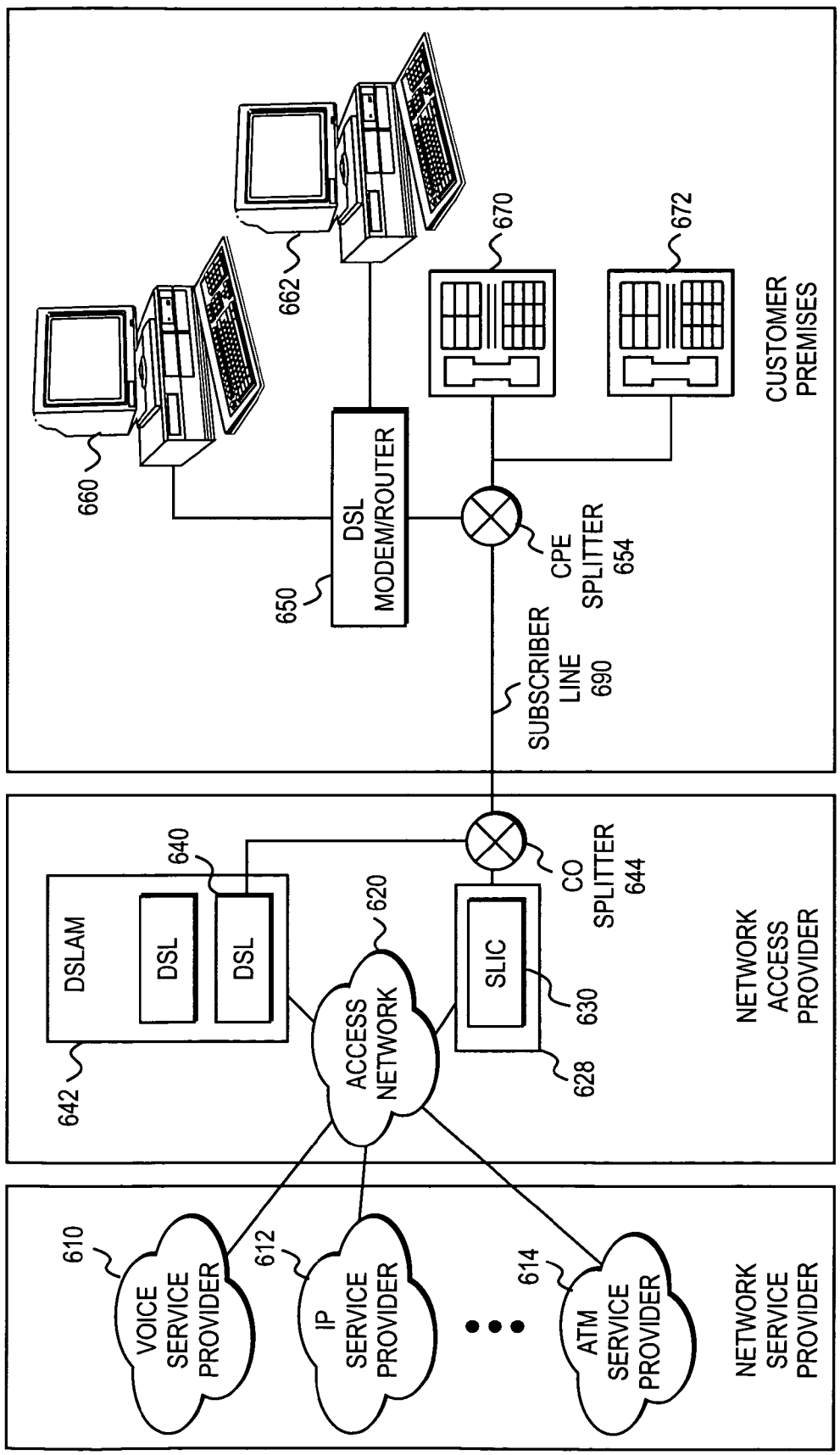
FIG. 6 illustrates one embodiment communication architecture supporting voice and digital data on the same subscriber line.

FIG. 6 illustrates one embodiment of a communications network model supporting voiceband communications associated with plain old telephone services (POTS) telephone system. The network model is divided into three physical domains: network service provider(s) 602, network access providers 604, and customer premises 606.

The network service providers (NSP) may have networks that span large geographic areas. Typically, however, the customer premises (CP) must be located within a specified distance of the network access provider (NAP) as a result of electrical specifications on the subscriber line 690. Thus network access providers typically have a number of central offices (CO) that support customers within a specified radius. Local exchange carriers (LEC) and competitive local exchange carriers (CLEC) are examples of network access providers.

The communications network model supports voice and digital services (e.g., xDSL) on a common subscriber line 690. Various digital services may utilize different encoding algorithms (e.g., two binary one quaternary (2B1Q)). The POTS (plain old telephone service) subscriber equipment such as telephones 670, 672 are connected to a POTS subscriber line interface circuit (SLIC 530) residing on a POTS linecard 628 via subscriber line 690. The NAP access network 620 couples the POTS linecard to a voice service provider network 610 such as the PSTN.

A digital subscriber line access multiplexer (DSLAM) 642 has a plurality of DSL linecards 640. The access network 620 enables communication with digital network service providers such as Internet protocol (IP) service providers 612 and asynchronous transfer mode (ATM) service providers 614. A DSLAM linecard provides a connection from one of the digital networks via access network 620 to the subscriber line 690 through the use of a central office splitter 644.

The splitter 644 serves to route the appropriate portion of the analog channel of the subscriber line 690 to one of the DSL linecard 640 and the POTS linecard 628. In particular, the splitter filters out non-voiceband spectral components so that the POTS linecard receives the voiceband spectral components from the subscriber line. The splitter filters out the voiceband communications so that the DSL linecard 640 receives only the spectral components associated with xDSL communications. The splitter also protects the DSL linecard from the large transients and control signals associated with the POTS communications on the subscriber line.

The CO splitter thus effectively splits upstream communications from the subscriber equipment into at least two spectral ranges or channels: voiceband and non-voiceband. The upstream voiceband range is provided to the POTS linecard and the upstream non-voiceband range is provided to the DSL linecard. The splitter couples the distinctly originating downstream voiceband and downstream non-voiceband communications to a common physical subscriber line 690.

A customer premises equipment splitter 654 may also be required at the customer premises for the POTS subscriber equipment 670, 672. The CPE splitter 654 passes only the voiceband portion of the subscriber line communications to the POTS subscriber equipment.

In one embodiment, the CPE splitter provides the DSL communications to a DSL modem 650 that serves as a communications interface for digital subscriber equipment such as computers 660, 662. In one embodiment, the DSL modem includes router functionality.

The DSL service overlays the existing POTS service on the same subscriber line. This solution avoids the capital costs of placing dedicated digital subscriber lines and permits utilizing existing POTS linecards. Each of the DSL modem 640 and the DSL modem/router 650 may utilize a delta-sigma modulator.

The International Telecommunication Union (ITU) has set forth a series of recommendations for subscriber line data transmission. These recommendations are directed towards communications using the voiceband portion of the communications spectrum ("V.x" recommendations) as well as communications utilizing frequency spectrum other than the voiceband portion (e.g., "xDSL" recommendations).

The V.x recommendations have evolved over time to support ever higher data rates. ITU-T Recs. V.22 bis, V.32, V.32 bis, V.34, and V.90, for example, relate to increasing bit-per-second data rates of 2400, 9600, 14400, 33600, and 56000 bit/sec. Compression standards such as V.42 bis can further increase the effective data rates. Generally, voiceband modems will use a recommended handshaking protocol to negotiate the highest possible data rate.

Asymmetric digital subscriber line (ADSL) communications represent one variant of xDSL communications. Exemplary ADSL specifications are set forth in "ITU Rec. G.992.2 (July 1999) Splitterless asymmetric digital subscriber line (ADSL) transceivers" (also referred to as G.LITE), and "ITU Rec. G.992.1 (July 1999) Asymmetric digital subscriber line (ADSL) transceivers" (also referred to as full rate ADSL).

Figure 7:
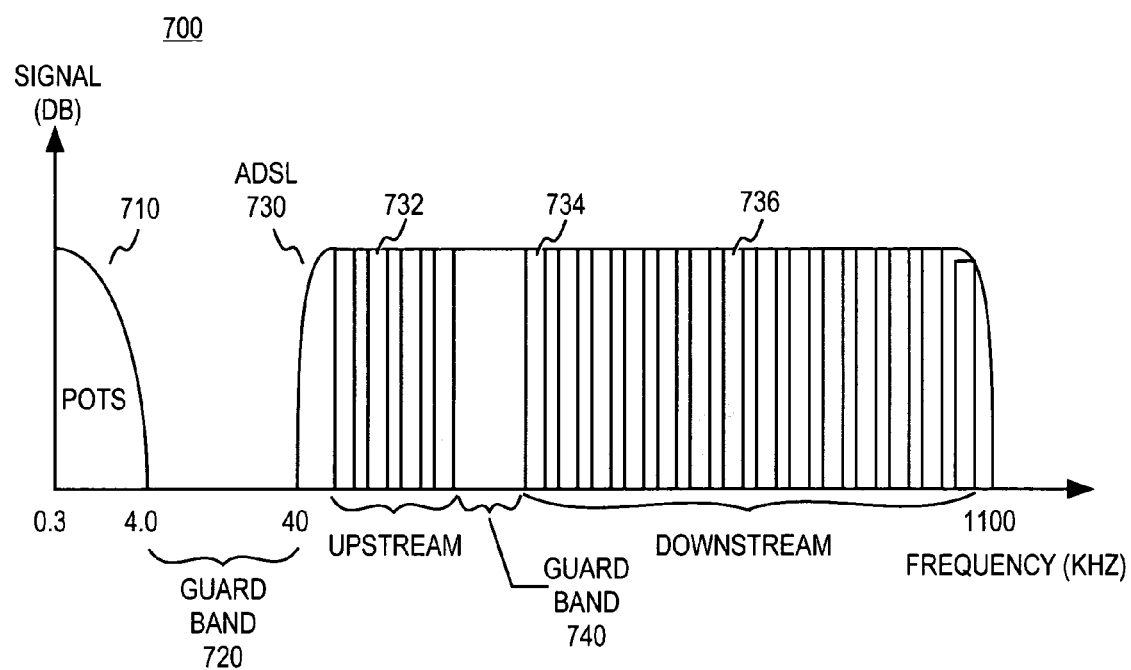
FIG. 7 illustrates one embodiment of communication spectrum allocated for a subscriber line.

FIG. 7 illustrates one embodiment of the communication spectrum allocation 700 for a subscriber line including portions of the analog channel used by voiceband modems (POTS 710) as well as xDSL modems (ADSL 730). POTS communications typically use the voiceband range of 300-4000 Hz. ADSL as set forth in ITU Rec. G.992.1 (ADSL) is in a range of approximately 25-1100 KHz. A guard band 720 separates the POTS and ADSL ranges.

There are multiple line coding variations for xDSL. Carrierless Amplitude Phase (CAP) and Discrete Multi-Tone modulation both use the fundamental techniques of quadrature amplitude modulation (QAM). CAP is a single carrier protocol where the carrier is suppressed before transmission and reconstructed at the receiving end. DMT is a multicarrier protocol. FIG. 7 illustrates DMT line coding.

DMT modulation has been established as a standard line code for ADSL communication. For full-rate ADSL, the available ADSL bandwidth is divided into 256 sub-channels. Each sub-channel 734 is associated with a carrier. The carriers (also referred to as tones) are spaced 4.3125 KHz apart. Each sub-channel is modulated using quadrature amplitude modulation (QAM) and can carry 0-15 bits/Hz. The actual number of bits is allocated depending upon line conditions. Thus individual sub-channels may be carrying different numbers of bits/Hz. Some sub-channels 736 might not be used at all. ADSL uses some sub-channels 734 for downstream communication and other sub-channels 732 for upstream communication. The upstream and downstream sub-channels may be separated by another guard band 740.

Varying ADSL protocols may use a different number of sub-channels or a different spacing between sub-channel carriers.

During initialization DMT measures the signal-to-noise ratio of each sub-channel to assign a data rate. Generally, greater data rates (i.e., more bits/Hz) are assigned to the lower sub-channels because signals are attenuated more at higher frequencies. DMT implementations may also incorporate rate adaption to monitor the line conditions and dynamically change the data rate for sub-channels.

Figure 8:
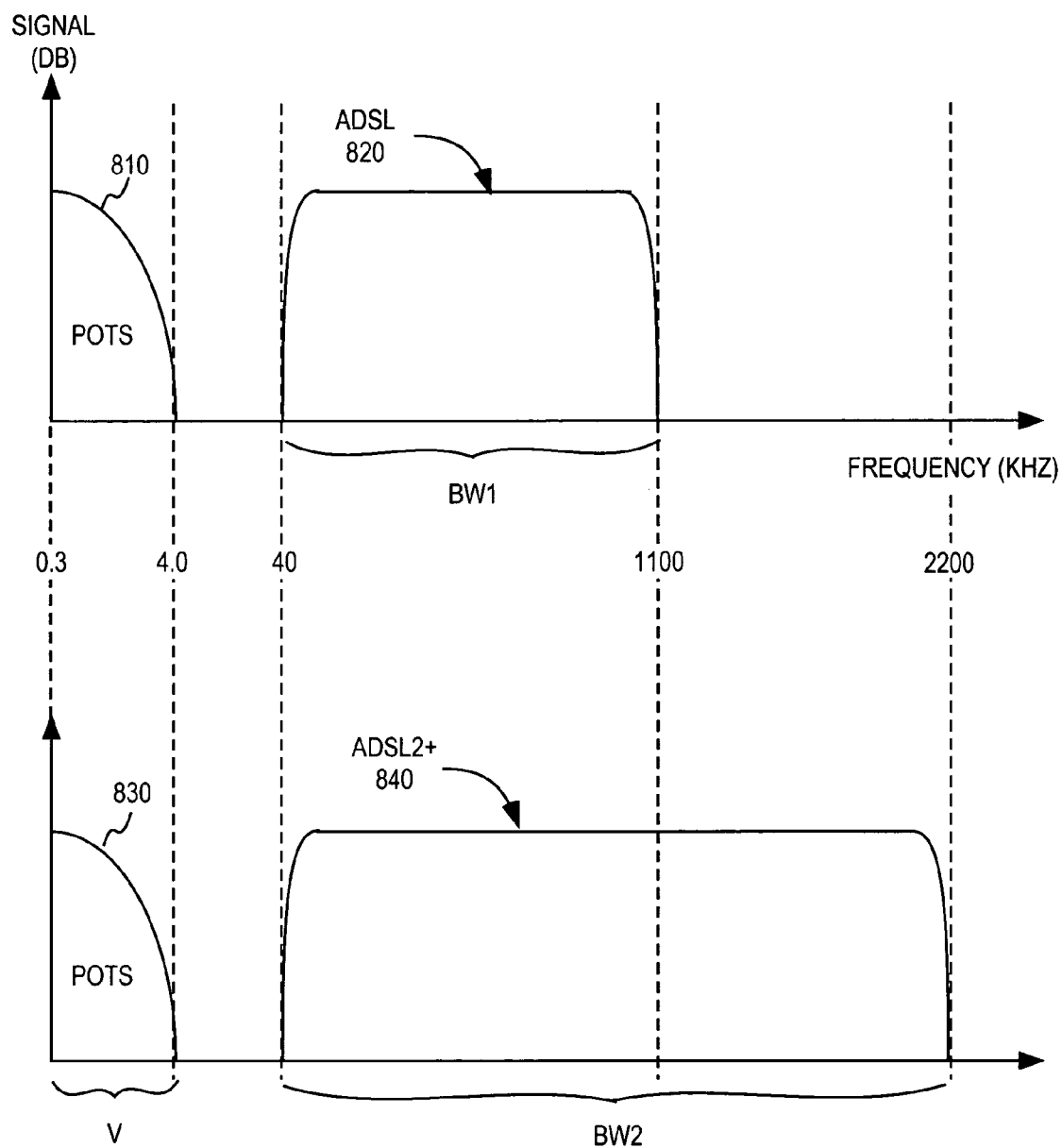
FIG. 8 illustrates subscriber line communication spectrum allocation for different digital subscriber line communication protocols.

Various xDSL protocols have a different spectral profile. FIG. 8 contrasts subscriber line communication spectrum allocation for different digital subscriber line communication protocols 820, 840. Full rate ADSL 820 utilizes frequencies in a range of approximately 25-1100 kHz (i.e., bandwidth BW1). Alternative xDSL protocols, however, may utilize different frequency bands. ITU Rec. (May 2003) "Asymmetrical Digital Subscriber Line (ADSL) transceivers—Extended bandwidth ADSL2 (ADSL2+ 30 )"(840) utilizes frequencies in a range of approximately 25-2200 kHz as indicated by bandwidth BW2. POTS 810, 830 communications use the voiceband range of 300-4000 Hz as indicated by bandwidth V regardless of the xDSL protocol.

Oversampling requires circuitry having an operational bandwidth more than twice the bandwidth of the band of interest. Oversampling for ADSL2+ 30 , for example, requires circuitry having approximately twice the operational bandwidth of full-rate ADSL to achieve the same oversampling ratio $$\left(\frac{f_S}{f_N}\right)$$

because $f_N$ for ADSL2+ is twice that of $f_N$ for full-rate ADSL. The greater bandwidth circuitry may not be practical for higher rate applications. The same NTF might not shape the noise appropriately within the selected band of interest when used at different oversampling ratios. The NTF can be selected in accordance with the oversampling ratio in order to provide greater noise immunity within the associated band of interest.

Thus one oversampling ratio can be used in conjunction with a first NTF for full-rate ADSL. A different oversampling ratio is used in conjunction with a distinct second NTF for ADSL2+.

Figure 9:
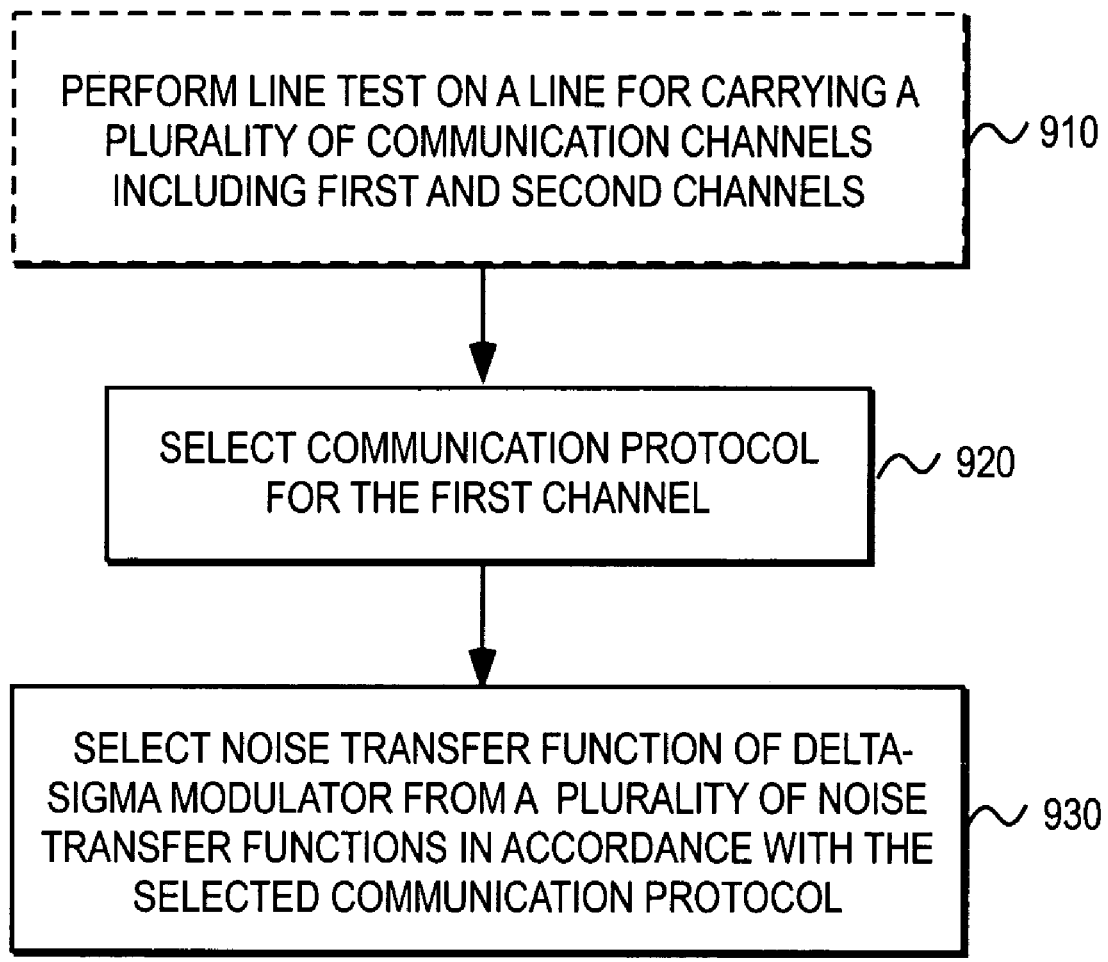
FIG. 9 illustrates one embodiment of a method for selecting a delta-sigma modulator noise transfer function in accordance with a communication protocol associated with a selected channel carried by a broadband communication medium.

FIG. 9 illustrates one embodiment of a method for selecting a delta-sigma modulator noise transfer function for a multiple channel communication line. A line test is optionally performed on a line for carrying a plurality of communication channels including first and second channels in step 910. The line test might be performed for the initial attempt to establish a communication channel in order to determine the feasibility of a particular communication protocol. Alternatively, the line test might be performed each time an attempt is made to establish a communication channel in the event that dynamic selection of communication protocols is possible. A communication protocol is selected for the first channel in step 920. A noise transfer function of a delta-sigma modulator is selected from a plurality of noise transfer functions in accordance with the selected communication protocol in step 930. The plurality of noise transfer functions distribute quantization noise differently between the first and second channels.

When noise shaping is applied to multiple channel lines, one may need to ensure that quantization noise shaped out of one channel is not shaped into another channel in a manner that introduces quantization noise into that channel beyond an acceptable level. For DSL applications, quantization noise in the channels carrying digital data tends to be more problematic than quantization noise in the channels carrying analog data.

Typically, however, the DSL and voiceband communication channels are separately routed via the splitter to circuitry dedicated for each channel. Thus even if the receiver portion of a DSL modem uses a modulator that shifts noise into the voiceband region of the spectrum, the voiceband data is being recovered from the signal provided to the voiceband circuitry rather than the signal provided to the DSL circuitry such that the DSL modulator has no affect on the voiceband channel.

Figure 10:
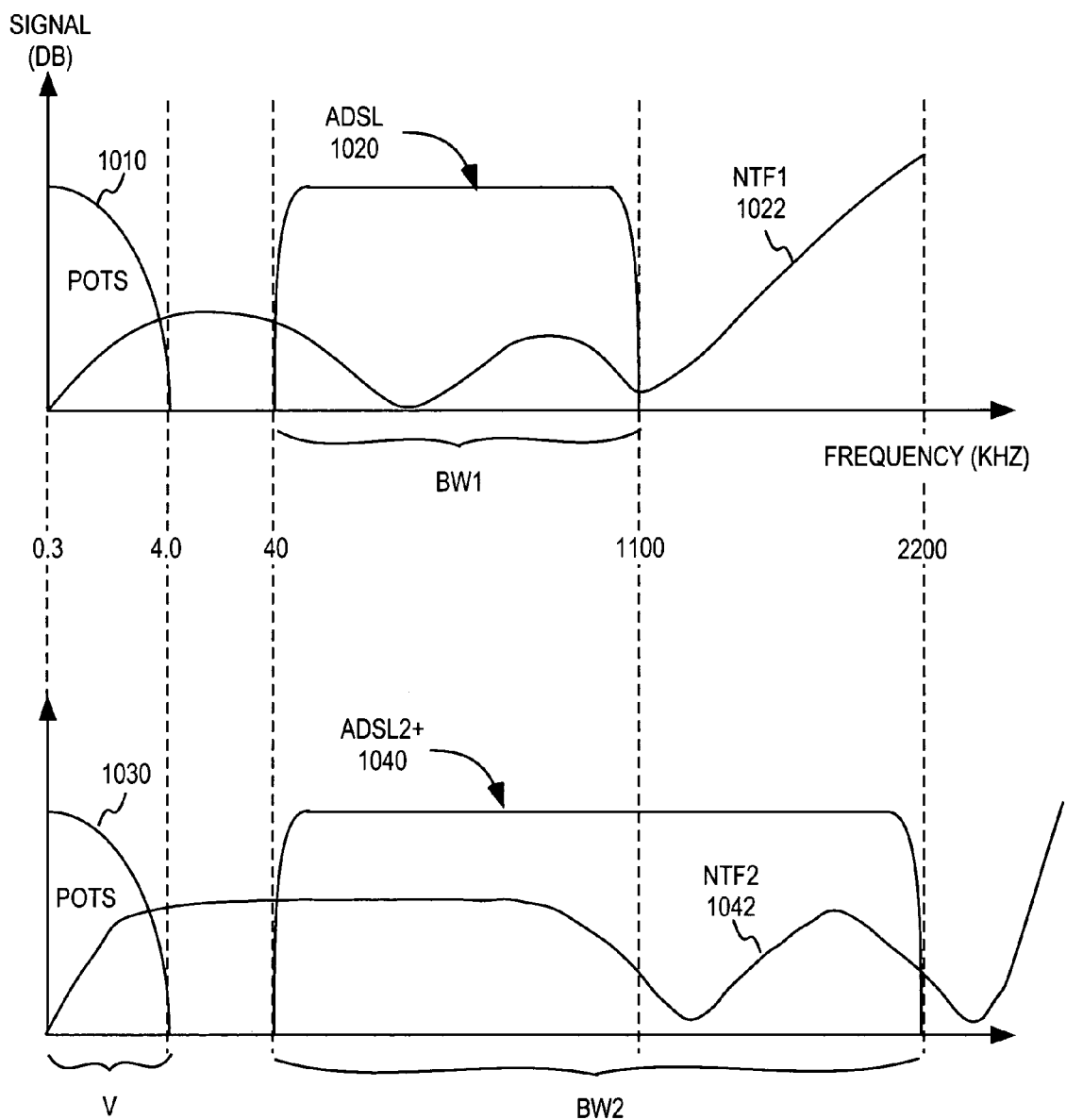
FIG. 10 illustrates application of different noise transfer functions to the subscriber line communication spectrum allocated to different digital subscriber line communication protocols.

FIG. 10 illustrates application of different noise transfer functions to the subscriber line communication spectrum allocated to different digital subscriber line communication protocols. For comparison, the noise transfer functions 1022 and 1042 are illustrated as being applied to signals of equal strength. Delta-sigma modulation is used to re-distribute quantization noise. At least some quantization noise may be shifted above or below the band of interest in order to alter the quantization noise distribution within the band of interest. The noise need not be shifted linearly or uniformly as illustrated in FIG. 3.

The full-rate ADSL 1020 communications have a bandwidth BW1. The ADSL2+ communications have a bandwidth BW2 distinct from that of BW1. The location and bandwidth (V) of POTS communications 1010, 1030 are the same irrespective of the xDSL protocol selected.

Noise transfer functions NTF1 1022 and NTF2 1042 spread quantization noise over the spectrum defined by the sampling frequency. If the same sampling frequency is used for both applications, there is more available spectrum (i.e., frequencies not of interest) to shape noise into with the full-rate ADSL protocol than there is in the ADSL2+ protocol. In the illustrated embodiment, NTF1 1022 generally provides a better in-band noise density profile for BW1 than NTF2 1042 does for BW2. The noise density profile of NTF1, however, renders NTF1 unsuitable for use with full-rate ADSL2+ communications because of the noise density profile outside of BW1 but within BW2. Similarly, NTF2 is less desirable within BW1 because the greater quantization noise density suggests that full-rate ADSL communications could only be supported over shorter subscriber lines (i.e., smaller geographic area).

Although ADSL2+ allocates a significantly greater communication bandwidth than ADSL, the higher frequencies become attenuated over longer subscriber line lengths effectively rendering a portion of the allocated bandwidth unusable. Use of the full allocated bandwidth permits ADSL2+ to surpass full-rate ADSL for shorter subscriber lengths. ADSL2+ throughput may be reduced to that of full-rate ADSL or worse as the length of the subscriber line increases.

Given that a portion of the ADSL2+ allocated bandwidth is unusable beyond a threshold of attenuation generally determined by geographic distance (i.e., subscriber line length), the modulator may switch to a different noise transfer function better suited for the effective bandwidth in order to preserve the highest throughput for the greatest distance. Thus for example, even if the communication protocol is unchanged, the noise transfer function may be selected in accordance with the effective bandwidth of the communication channel rather than the allocated bandwidth of the communication channel.

Figure 11:
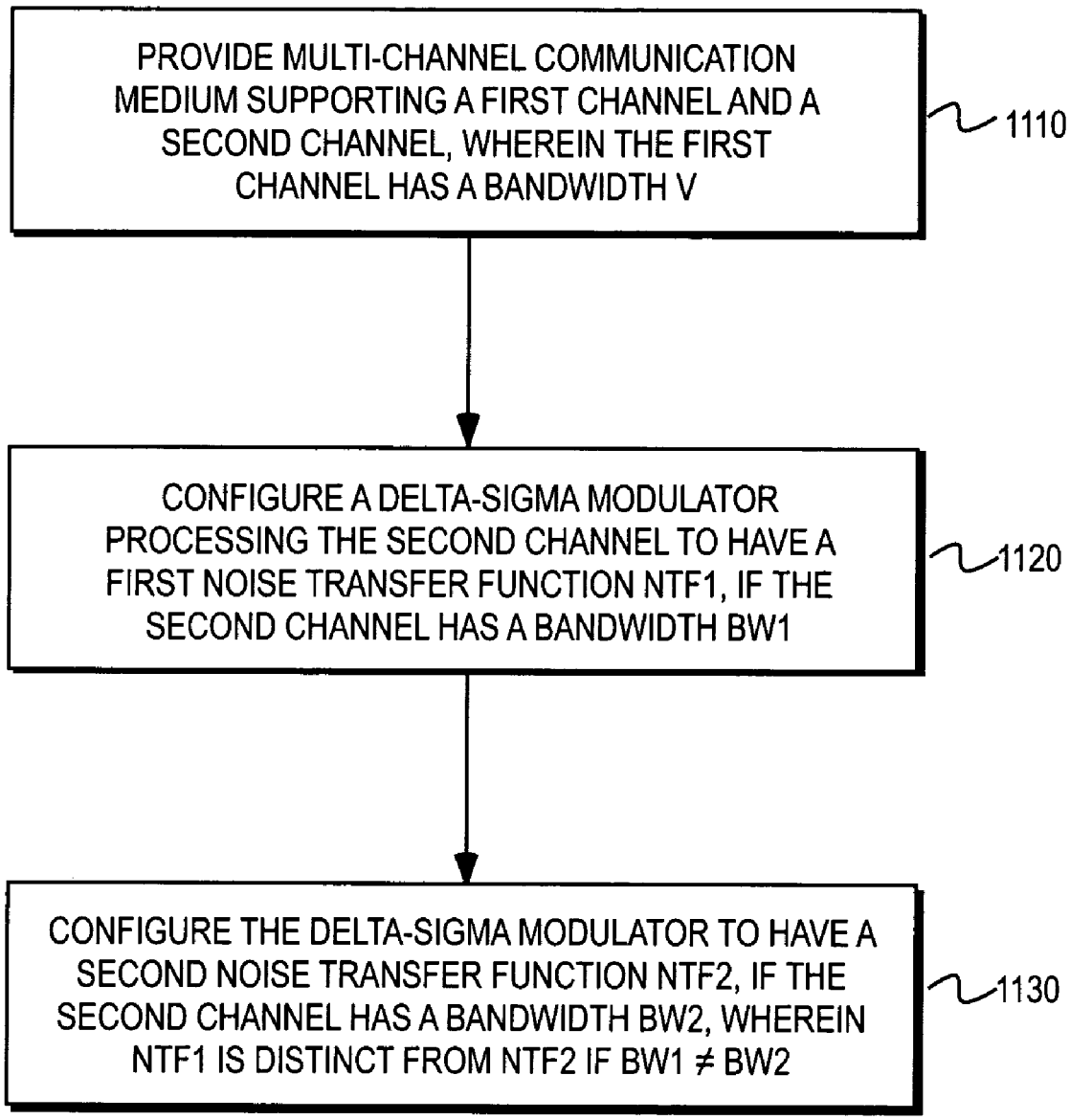
FIG. 11 illustrates one embodiment of a method for selecting a noise transfer function in accordance with a channel bandwidth of a selected channel.

FIG. 11 illustrates one embodiment of a method for selecting a noise transfer function in accordance with a channel bandwidth of a selected channel of a broadband communication medium. A multiple channel communication medium supporting first and second channels is provided in step 1110. In this embodiment the first channel has a bandwidth V. A delta-sigma modulator processing the second channel is configured to have a first noise transfer function NTF1, if the second channel has a bandwidth BW1 in step 1120. The delta-sigma modulator is configured to have a second noise transfer function NTF2, if the second channel has a bandwidth BW2 in step 1130. NTF1 is distinct from NTF2 when BW1 is not equal to BW2. Given an ADC delta-sigma modulator coupled to sample the second channel, for example, the modulator is configured to have different noise transfer functions depending upon the bandwidth of the sampled channel.

If the same sampling frequency is used for both ADSL and ADSL2+ applications, then the delta-sigma modulator is sampling at different oversampling ratios. Channels of different bandwidths result in different oversampling ratios. The noise transfer function can be varied as a function of the oversampling ratio of the selected channel.

Figure 12:
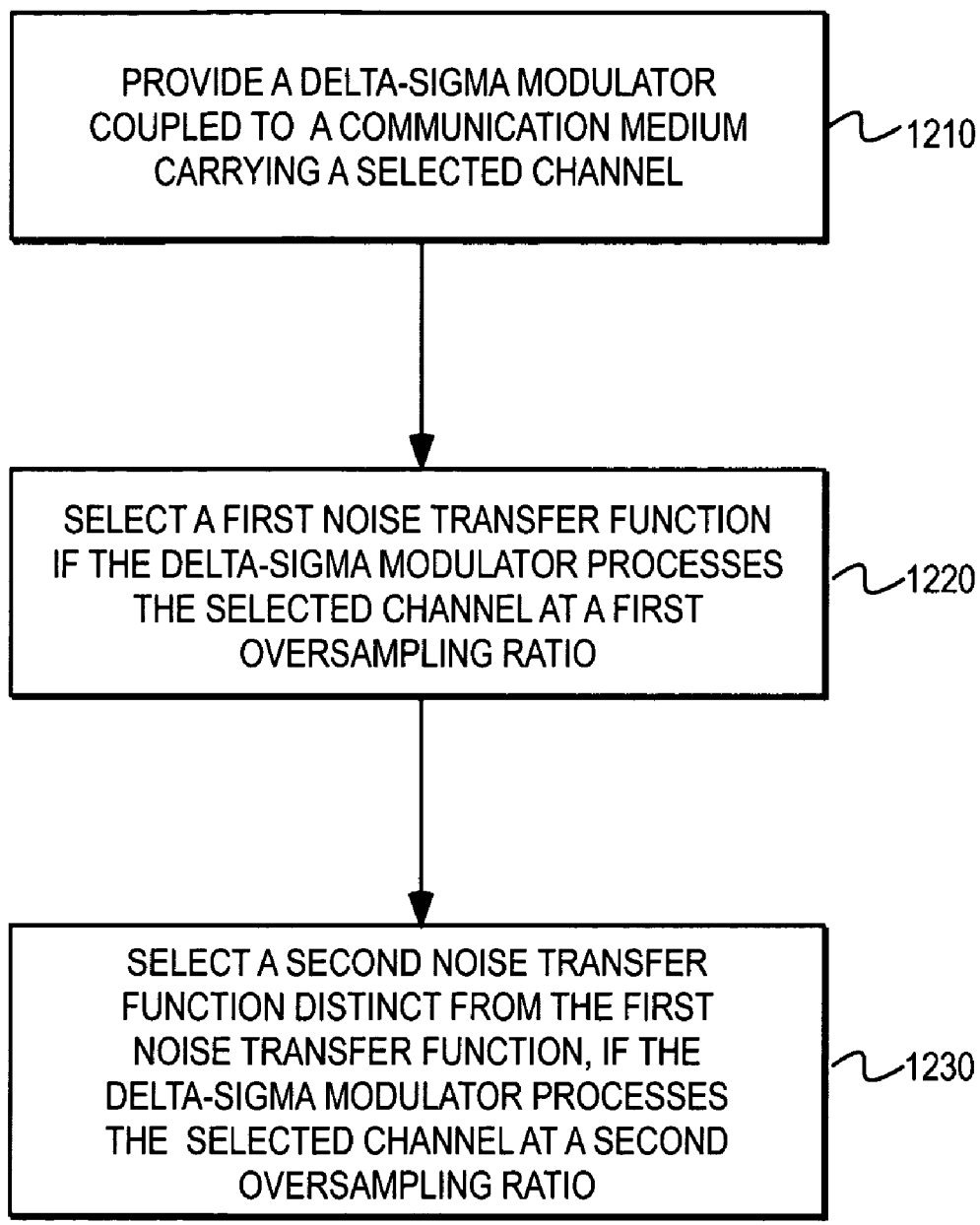
FIG. 12 illustrates one embodiment of a method for selecting a noise transfer function in accordance with an oversampling ratio of a selected channel.

FIG. 12 illustrates one embodiment of a method for selecting a noise transfer function in accordance with an oversampling ratio for a selected channel. In step 1210, a delta-sigma modulator coupled to a communication medium carrying a selected channel is provided. For example, an ADC delta-sigma modulator may be coupled to receive a broadband signal carrying the selected channel. A noise transfer function is then selected in accordance with the oversampling ratio. A first noise transfer function is selected if the selected channel is processed at a first oversampling ratio as indicated by step 1220. A second noise transfer function distinct from the first noise transfer function is selected if the selected channel is processed at a second oversampling ratio as indicated by step 1230.

Figure 13:
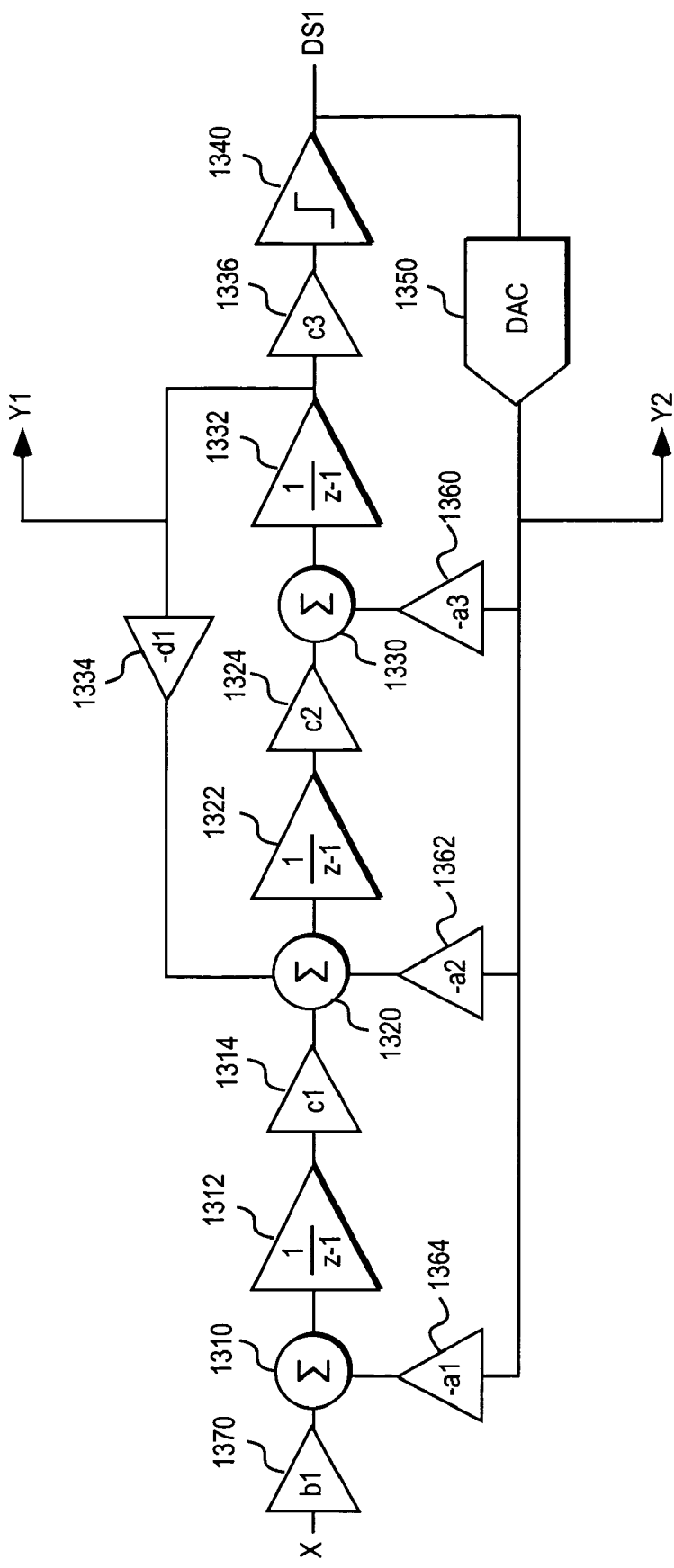
FIG. 13 illustrates a first delta-sigma modulated ADC (ADC1) forming a portion of one embodiment of a 3-2 delta-sigma modulated ADC.
Figure 14:
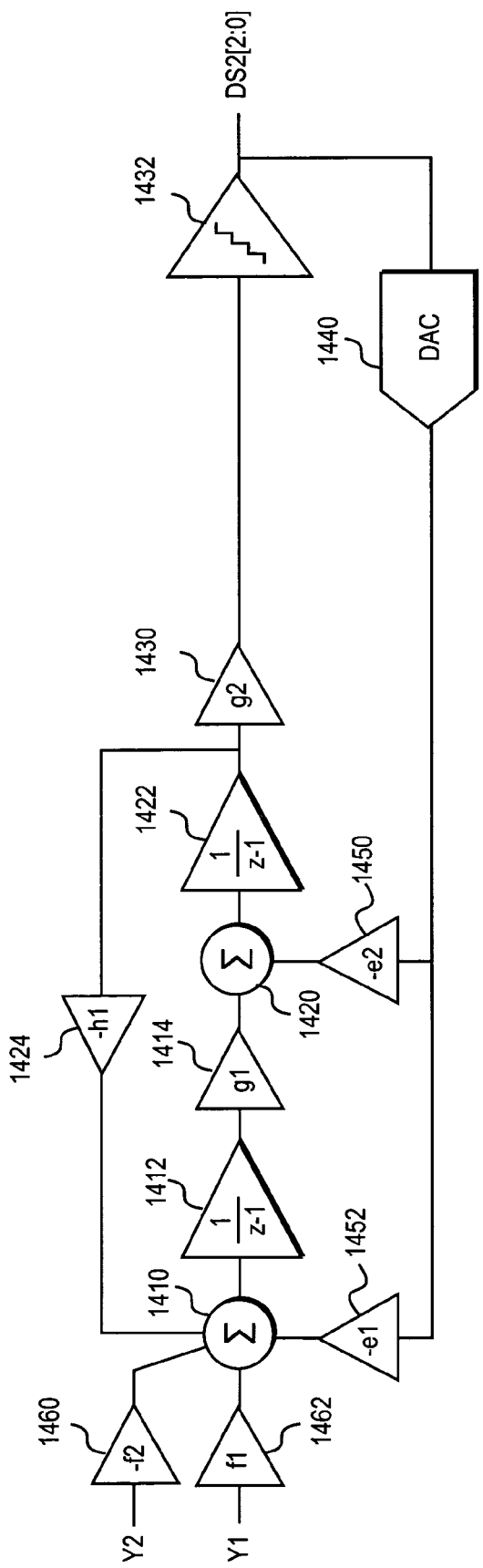
FIG. 14 illustrates a second delta-sigma modulated ADC (ADC2) forming another portion of the embodiment of the 3-2 delta-sigma modulator.

FIGS. 13-14 illustrates one embodiment of a 3-2 cascaded multi-bit delta-sigma modulator. A $3^{rd}$ order single bit quantizer 1340 is cascaded with a $2^{nd}$ order multiple bit quantizer 1432. The input signal "X" is sampled by ADC1 1300 and converted to the 1 bit digital output stream DS1. ADC2 1400 samples the unshaped quantization noise (from Y1, Y2) produced in ADC1 1300 and converts it to a 3 bit digital output stream DS2. The 3-2 delta-sigma modulator has a non-linear noise transfer function.

Referring to FIG. 13, the feedback loop of the single bit quantizer 1340 includes 3 stages evidenced by elements 1364, 1362, and 1360 having the indicated gain co-efficients. Element 1364, for example, has a gain of –a1. The feedback signals are added to the forward signal with summers 1310, 1320, and 1330. In one embodiment, ADC1 is composed of 3 delaying, non-inverting switched capacitor integrators 1312, 1322, 1332 (each having an associated gain stage 1314, 1324, and 1336, respectively), a single-bit quantizer 1340, and a single bit switched capacitor feedback DAC 1350. DAC 1350 converts the quantized output of the quantizer 1340 into an analog signal for input to these three stages. The input signal X is adjusted by gain co-efficient 1370 before being provided to the first summer 1310. ADC1 also has an intermediate feedback stage represented by element 1334. Y1 and Y2 represent signals provided to the cascaded ADC2.

Referring to FIG. 14, the Y1 and Y2 input signals are adjusted by gain elements 1462 and 1460, respectively. The feedback loop of the multiple bit quantizer 1432 includes 2 stages evidenced by elements 1450 and 1452. In one embodiment, ADC2 is composed of 2 delaying, non-inverting switched capacitor integrators 1412, 1422 (each having an associated gain stage 1414 and 1430, respectively). ADC2 has an intermediate feedback stage represented by element 1424. The feedback signals are added to the forward signal with summers 1410 and 1420.

Figure 15:
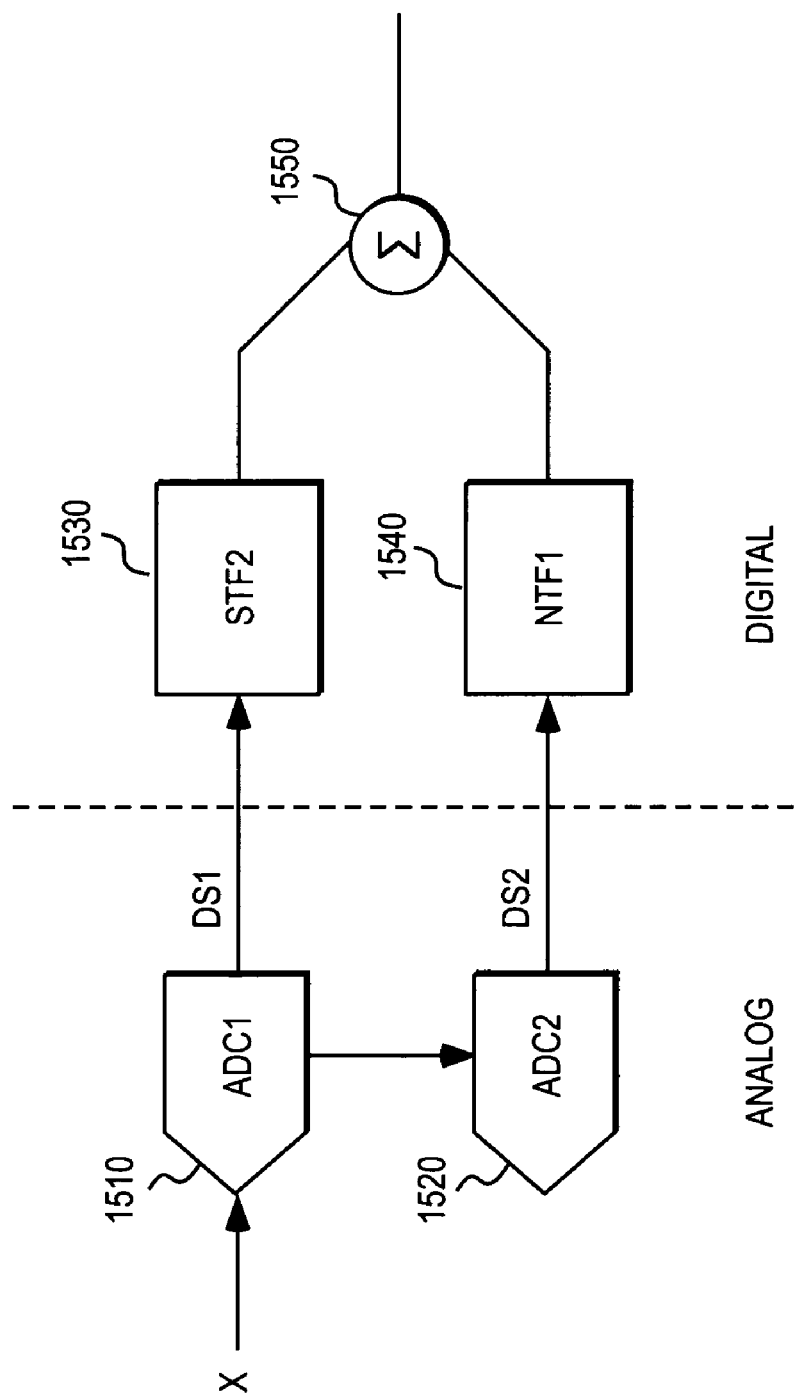
FIG. 15 illustrates the analog-to-digital converters of FIGS. 13-14 cascaded.

FIG. 15 provides an overview of the co-operation of ADC1 1510 and ADC2 1520 to shape quantization noise. Input signal X is sampled by ADC1 1510 and converted to a 1 bit digital output stream DS1. The unshaped quantization noise from ADC1 1510 is sampled by ADC2 1520 and noise shaped by the NTF1 1540 noise transfer function. The single bit output DS1 of ADC1 is filtered by the signal transfer function of ADC2 (i.e., STF2 1530). In one embodiment, the resulting streams are summed by summer 1550 to produce a 16 bit output.

In one embodiment, the nominal sampling frequency is 35 MHz. For full-rate ADSL (up to 1.1 MHz) this enables approximately 16 times oversampling. For ADSL2+ (up to 2.2 MHz) this enables approximately 8 times oversampling. The co-efficient values are selected to improve performance of the modulator over a particular frequency band. Changing the co-efficient values alters the noise transfer function. The co-efficients d1 and h1, for example, can be varied to achieve a different noise transfer function depending upon the band of interest.

In one embodiment, the variables of FIGS. 13-14 are selected to have the following values:

| ADC1 | ADC2 |
|---|---|
| a1 = 0.0781 | e1 = 0.1094 |
| a2 = 0.1406 | e2 = 0.2656 |
| a3 = 0.1250 | f1 = 0.2188 |
| b1 = 0.0781 | f2 = 0.2188 |
| c1 = 0.3438 | g1 = 0.75 |
| c2 = 0.3438 | g2 = 3.0 |
| c3 = 8.6250 | $h1 = \begin{cases} 0.0156 \text{ (full rate ADSL)} \\ 0.0469 \text{ (ADSL2+)} \end{cases}$ |
| $d1 = \begin{cases} 0.0625 \text{ (full-rate ADSL)} \\ 0.1875 \text{ (ADSL2+)} \end{cases}$ | |

A distinct noise transfer function may be achieved by varying any of these values. However, in one embodiment only the values d1 and h1 are changed in order to realize different noise transfer functions for ADSL (NTF1) and ADSL2+ (NTF2). If d1 and h1 are stored as digital values with a finite number of bits, then the noise transfer function is selectable from a discrete plurality of functions.

Figure 16:
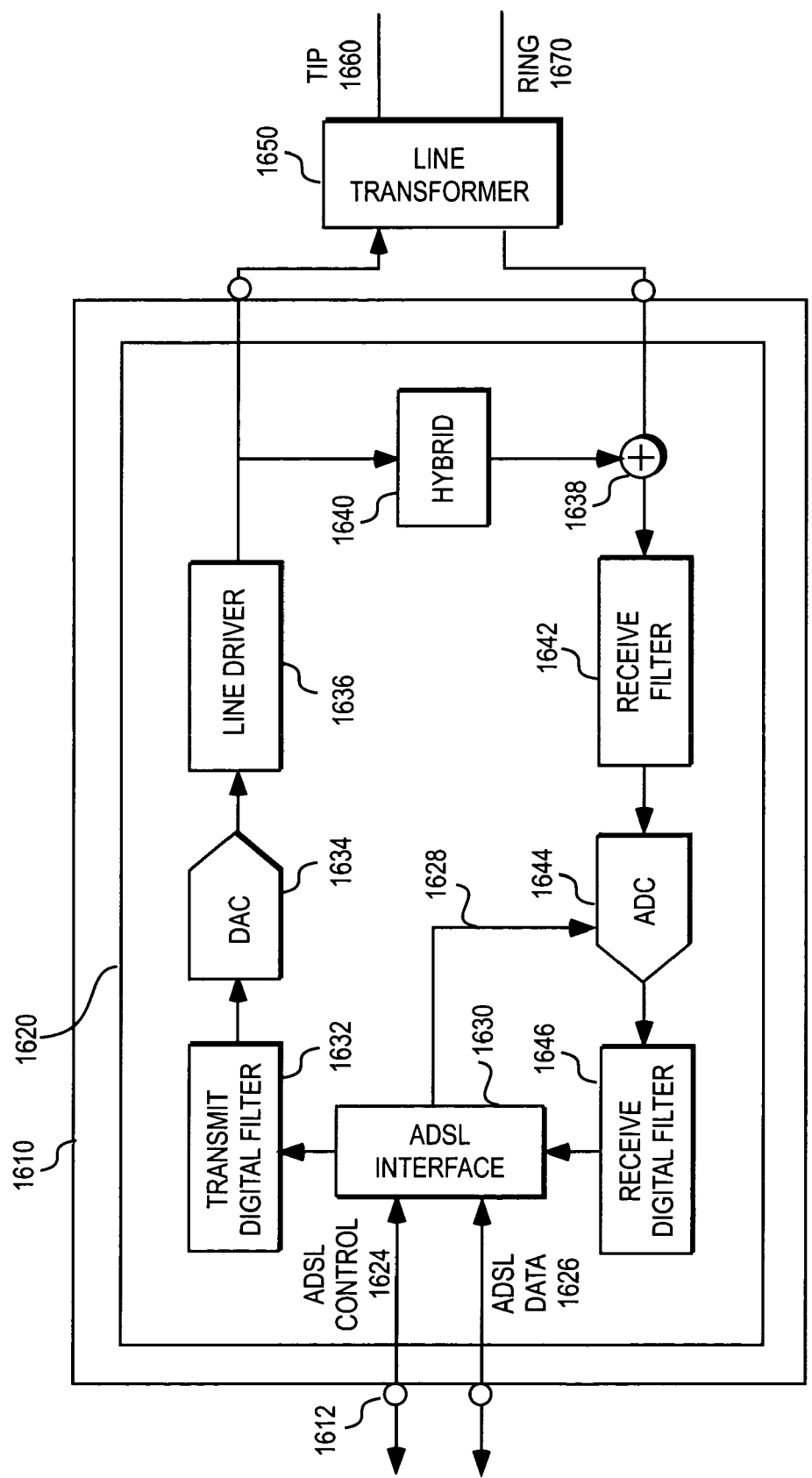
FIG. 16 illustrates one embodiment of an integrated circuit including a delta-sigma modulated analog-to-digital converter.

FIG. 16 illustrates one embodiment of an xDSL modem with most of the components residing on an integrated circuit die 1620 within an integrated circuit package 1610. ADSL interface 1630 receives ADSL control signals 1624 via one or more pins 1612 of the integrated circuit package. ADSL interface also provides an interface for bi-directional communication of ADSL data 1626.

The upstream path (data transmitted from the modem to the subscriber line) includes a transmit digital filter 1632, a digital-to-analog converter 1634, and a line driver 1636. The ADSL modem is coupled to the tip 1660 and ring 1670 of the subscriber line using line transformer 1650 in the illustrated embodiment.

The subscriber line carries both the upstream and downstream signals. Thus the receive path of the xDSL modem must eliminate the upstream signal from the signal appearing on the subscriber line. Hybrid 1640 and summer 1638 serve to eliminate the upstream signal such that only the downstream signal (data from the subscriber line received by the modem) is presented to receive filter 1642. Receive filter 1642 conditions the analog downstream signal before provided it to ADC 1644. In one embodiment, ADC 1644 is a delta-sigma modulator with a selectable noise transfer function. In one embodiment, the noise transfer function is selected by a control signal 1628 provided by the ADSL interface. The delta-sigma modulator may thus be fabricated on an integrated circuit. In one embodiment, the integrated circuit is a complementary metal oxide semiconductor integrated circuit.

The output of ADC 1644 is applied to receive digital filter 1646. ADSL interface 1630 then communicates the interpreted digital downstream data on ADSL data 1626. In various embodiments, the ADSL data signal may be subdivided into distinct transmit and receive data paths. In this particular embodiment, any voice signals carried by the subscriber line would be handled by other circuitry. Thus this application would have relaxed constraints on the amount of quantization noise that may be shifted into the voiceband region.

Delta-sigma modulators with selectable noise transfer functions have been described. Methods and apparatus for varying the noise transfer function in accordance with an oversampling ratio, a bandwidth, or a communication protocol of a selected communication channel have been described.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. An apparatus, comprising:
   a delta-sigma modulator having a variable noise transfer function and a fixed sampling frequency, wherein the modulator is coupled to a communication medium carrying a selected channel, wherein the noise transfer function is varied in accordance with at least one of a communication protocol, bandwidth, and oversampling ratio associated with the selected channel.

2. The apparatus of claim 1 wherein the noise transfer function has a first value NTF1 if the selected channel has a first bandwidth BW1, wherein the noise transfer function has a distinct second value NTF2 if the selected channel has a second bandwidth BW2 distinct from BW1.

3. The apparatus of claim 1 wherein the noise transfer function is selected to have a first value NTF1 if the modulator is processing the selected channel at a first oversampling ratio, wherein the noise transfer function is selected to have a second value NTF2 if the modulator is processing the selected channel at a second oversampling ratio.

4. The apparatus of claim 1 wherein the communication medium is a subscriber line.

5. The apparatus of claim 1 wherein the noise transfer function is selectable from a discrete plurality of functions.

6. A method comprising the steps:
   a) selecting a communication protocol for a first channel; and
   b) providing a delta-sigma modulator of fixed sampling frequency coupled to a communication medium carrying the first channel, the modulator having a variable noise transfer function selected to vary noise shaping within the first channel in accordance with the selected communication protocol.

7. The method of claim 6 further comprising:
   c) performing a line test on a line for carrying the first channel and a second channel in order to select the communication protocol.

8. The method of claim 6 wherein the communication medium carries a second channel, wherein an amount of quantization noise in the second channel varies in accordance with the selected noise transfer function.

9. The method of claim 8 wherein the second channel is a voiceband channel having a bandwidth less than or equal to 4 KHz.

10. The method of claim 6 wherein the selected communication protocol is a digital multi-tone communication protocol having a bandwidth no greater than 1.1 MHz.

11. The method of claim 6 wherein the selected communication protocol is a digital multi-tone communication protocol having a bandwidth no greater than 2.2 MHz.

12. The method of claim 7 wherein the line is an analog subscriber line.

13. A method comprising the steps:
   a) providing a multi-channel communication medium supporting a first channel and a second channel, wherein the first channel has a bandwidth V; and
   b) providing a delta-sigma modulator of fixed sampling frequency coupled to the multi-channel communication medium, wherein the delta-sigma modulator is configured to have a first noise transfer function NTF1 if the second channel has a bandwidth BW1, wherein the delta-sigma modulator is configured to have a second noise transfer function NTF2 if the second channel has a bandwidth BW2.

14. The method of claim 13 wherein NTF1 is distinct from NTF2 if BW1≠BW2.

15. A method comprising the steps:
   a) providing a delta-sigma modulator coupled to receive a broadband signal including a selected channel, wherein the delta-sigma modulator has a selectable noise transfer function and a fixed sampling frequency;
   b) selecting a first noise transfer function NTF1 if the delta-sigma modulator processes the selected channel at a first oversampling ratio; and
   c) selecting a second noise transfer function NTF2, if the delta-sigma modulator processes the selected channel at a second oversampling ratio.

16. method of claim 15 wherein NTF1≠NTF2 if the first and second oversampling ratios are distinct.

* * * * *